(12) United States Patent
Wang et al.

(10) Patent No.: US 11,508,920 B2
(45) Date of Patent: Nov. 22, 2022

(54) DISPLAY DEVICE AND FLEXIBLE OLED PANEL THEREOF

(71) Applicant: KunShan Go-Visionox Opto-Electronics Co., Ltd, Jiangsu (CN)

(72) Inventors: Zhixiang Wang, Kunshan (CN); Mengfan Wang, Kunshan (CN); Jinku Li, Kunshan (CN); Yang Shen, Kunshan (CN); Menghua Kang, Kunshan (CN); Xin Ye, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 285 days.

(21) Appl. No.: 16/838,342

(22) Filed: Apr. 2, 2020

(65) Prior Publication Data

US 2020/0259108 A1    Aug. 13, 2020

Related U.S. Application Data

(63) Continuation of application No. PCT/CN2019/078916, filed on Mar. 20, 2019.

(30) Foreign Application Priority Data

Sep. 28, 2018   (CN) .......................... 201811142819.6

(51) Int. Cl.
   *H01L 51/00*   (2006.01)
   *G09G 3/3266*   (2016.01)
   (Continued)

(52) U.S. Cl.
   CPC ....... *H01L 51/0097* (2013.01); *G09G 3/3266* (2013.01); *G09G 3/3275* (2013.01);
   (Continued)

(58) Field of Classification Search
   CPC ............. H01L 51/0097; H01L 27/3218; H01L 27/3276; H01L 51/5212; H01L 2251/5338;
   (Continued)

(56) References Cited

U.S. PATENT DOCUMENTS 10,593,741 B2 *   3/2020   Khachatryan ......... B32B 15/095
10,797,124 B2 *  10/2020   Song ................... H01L 51/0096
(Continued)

FOREIGN PATENT DOCUMENTS

CN          103700692 A       4/2014
CN          104124267 A      10/2014
(Continued)

OTHER PUBLICATIONS

Written Opinion of the International Searching Authority dated Jun. 28, 2019, in corresponding International application No. PCT/CN2019/078916; 8 pages.
(Continued)

*Primary Examiner* — S M Sohel Imtiaz
(74) *Attorney, Agent, or Firm* — Maier & Maier, PLLC

(57) ABSTRACT

A display device and a flexible OLED panel. The flexible OLED panel includes: a flexible substrate, and OLED light emitting elements on the substrate. The OLED light emitting elements include pixel circuits and functional layers including anodes disposed above the pixel circuits. The flexible OLED panel further includes pixel unit regions and non-pixel unit regions. The pixel unit regions are arranged in an array, the non-pixel unit regions are disposed between adjacent pixel unit regions. At least one of the anodes, and corresponding transistors in the pixel circuits are located in one pixel unit region, respective transistors in the adjacent pixel unit regions are connected via electrical connection lines, so that the electrical connection lines pass through at
(Continued)

least one non-pixel unit region, and a portion of the electrical connection lines in the at least one non-pixel unit region is coated by an organic film layer.

20 Claims, 3 Drawing Sheets

(51) Int. Cl.
    *G09G 3/3275*     (2016.01)
    *H01L 27/32*     (2006.01)
    *H01L 51/52*     (2006.01)

(52) U.S. Cl.
    CPC ...... *H01L 27/3218* (2013.01); *H01L 27/3276* (2013.01); *H01L 51/5212* (2013.01); *G09G 2380/02* (2013.01); *H01L 2251/5338* (2013.01)

(58) Field of Classification Search
    CPC ... H01L 27/3248; H01L 27/326; H01L 27/32; H01L 27/3244; H01L 27/3262; G09G 3/3266; G09G 3/3275; G09G 2380/02; G09G 3/3225; Y02E 10/549; G09F 9/301
    See application file for complete search history.

(56) References Cited

U.S. PATENT DOCUMENTS

| | | | |
|---|---|---|---|
| 10,861,911 B2 * | 12/2020 | Kim | H01L 51/525 |
| 10,868,096 B2 * | 12/2020 | Park | H01L 51/5218 |
| 10,978,675 B2 * | 4/2021 | Lee | H01L 51/5256 |
| 2010/0207519 A1 * | 8/2010 | Hayashi | H01L 51/5253 313/504 |
| 2014/0319480 A1 * | 10/2014 | Kang | H01L 27/1237 257/40 |
| 2016/0118451 A1 * | 4/2016 | Youn | H01L 29/78603 257/66 |
| 2017/0040406 A1 * | 2/2017 | Park | H05K 1/028 |
| 2019/0050096 A1 * | 2/2019 | Wang | H01L 51/5253 |
| 2019/0363149 A1 * | 11/2019 | Okabe | H01L 51/5218 |
| 2019/0386240 A1 * | 12/2019 | Wang | H01L 51/5209 |

FOREIGN PATENT DOCUMENTS

| | | |
|---|---|---|
| CN | 104932137 A | 9/2015 |
| CN | 106505091 A | 3/2017 |
| CN | 107359185 A | 11/2017 |
| CN | 1077731881 A | 2/2018 |
| CN | 109300948 A | 2/2019 |

OTHER PUBLICATIONS

Office Action dated Apr. 28, 2020, in corresponding Chinese Application No. 201811142819.6; 15 pages.

Office Action and Search Report dated Jul. 26, 2019 in corresponding Chinese application No. 201811142819.6; 13 pages including English-language translation.

International Search Report dated Jun. 28, 2019 in corresponding International application No. PCT/CN2019/078916; 4 pages.

* cited by examiner

DISPLAY DEVICE AND FLEXIBLE OLED PANEL THEREOF

CROSS REFERENCE TO RELATED APPLICATIONS

This application is a Bypass Continuation Application of International Patent Application No. PCT/CN2019/078916, filed on Mar. 20, 2019, which claims priority to Chinese Patent Application No. 201811142819.6, titled "A DISPLAY DEVICE AND FLEXIBLE OLED PANEL THEREOF", filed on Sep. 28, 2018, the contents of all of which are incorporated herein by reference.

FIELD

The present application relates to the field of OLED display device technology, and in particular, to a display device and a flexible OLED panel thereof.

BACKGROUND

With the development of display technology, bendable and flexible display devices based on flexible substrates have been developed and manufactured. Organic Light-Emitting Diodes (referred briefly to as OLEDs) have the advantages of low power consumption and good display brightness due to its self-luminous characteristic compared with other display devices. It is also easier for OLED display device based on flexible substrate to achieve a bendable display with a smaller bending radius. Therefore, the manufacture of OLED display panels based on flexible substrates has attracted wide attention, and bending life has become one of properties that must be verified for reliability of flexible OLED display panels.

SUMMARY

An object of the present application is to provide a display device and a flexible OLED panel thereof, so as to buffer the stressing force of anodes during the bending of the OLED display panel, thereby improving the reliability of the OLED display panel.

In order to achieve the above object, a first aspect of the present application provides a flexible OLED panel. The flexible OLED panel includes: a flexible substrate, and a plurality of OLED light emitting elements positioned on the flexible substrate. The plurality of OLED light emitting elements include a plurality of pixel circuits and a plurality of functional layers disposed above the plurality of pixel circuits, and the plurality of functional layers include a plurality of anodes. The flexible OLED panel further includes a plurality of pixel unit regions and a plurality of non-pixel unit regions, the plurality of pixel unit regions are arranged in an array, the plurality of non-pixel unit regions are disposed between adjacent ones of the plurality of pixel unit regions. At least one of the plurality of anodes and corresponding ones of a plurality of transistors in the plurality of pixel circuits are located in one of the plurality of pixel unit regions, and respective transistors in the adjacent ones of the plurality of pixel unit regions are connected via a plurality of electrical connection lines, so that the plurality of electrical connection lines pass through at least one of the plurality of non-pixel unit regions, where a portion of the plurality of electrical connection lines that is in the at least one of the plurality of non-pixel unit regions is coated by an organic film layer.

Optionally, each of the plurality of non-pixel unit regions includes a portion of the plurality of electrical connection lines which is coated by the organic film layer, and the organic film layer.

Optionally, the plurality of electrical connection lines include a plurality of scan lines arranged in rows, as well as data lines and power lines arranged in columns.

Optionally, the plurality of anodes are located above the plurality of transistors, the plurality of transistors include a switching transistor and a driving transistor, and at least one of the switching transistor and the driving transistor entirely falls within an orthographic projection of a corresponding one of the plurality of anodes.

Optionally, the plurality of anodes are located above the plurality of transistors, the plurality of transistors include a switching transistor and a driving transistor, and at least one of the switching transistor and the driving transistor partially falls within an orthographic projection of a corresponding one of the plurality of anodes.

Optionally, an inorganic support layer is provided on a lower surface of at least one of the plurality of anodes.

Optionally, each of the plurality of pixel unit regions includes a plurality of sub-pixels, each of the plurality of sub-pixels is corresponding to one of the plurality of anodes, and a plurality of inorganic support layers formed at lower surfaces of the plurality of anodes are connected into a whole.

Optionally, each of the pixel unit regions includes a plurality of sub-pixels, and the plurality of sub-pixels are arranged around a center. Each of the plurality of sub-pixels is corresponding to one of the plurality of pixel circuits and one of the plurality of anodes, and the anode is located above ones of the plurality of transistors which are in the corresponding one of pixel circuits. The plurality of transistors include a switching transistor and a driving transistor. Each of the pixel unit regions comprises a plurality of conductive plugs. The one of the plurality of anodes and a drain of the driving transistor are connected via corresponding one of the plurality of conductive plugs, and the plurality of conductive plugs are gathered toward the center.

Optionally, the plurality of sub-pixels include a red sub-pixel, a green sub-pixel, and a blue sub-pixel. The red sub-pixel, the green sub-pixel and the blue sub-pixel are arranged into a triangular shape, and the plurality of conductive plugs corresponding to the red sub-pixel, the green sub-pixel and the blue sub-pixel are gathered toward a center of the triangular shape.

Optionally, a film layer is disposed between the one of the plurality of anodes and the corresponding ones of the plurality of transistors, and the plurality of conductive plugs are formed in the film layer.

Optionally, the film layer is at least one of an organic film layer or an inorganic film layer.

Optionally, a material of the inorganic support layer includes at least one of silicon dioxide, silicon nitride, or silicon oxynitride.

Optionally, the plurality of pixel unit regions include inorganic material layers, each of the inorganic material layers includes at least one of a silicon nitride layer, a silicon oxynitride layer, or a silicon oxide layer, and each of the inorganic material layers is formed into at least one layer.

A second aspect of the present application further provides a display device including a flexible OLED panel according to the first aspect.

The beneficial effects of the present application lie in that: in the present application, by disposing the pixel unit regions and the non-pixel unit regions on the flexible substrate, the anodes having strong rigidity and poor flexibility and the transistors including a plurality of inorganic material layers in the array pixel circuits are concentratively disposed in the pixel unit regions, and the non-pixel unit regions are substantially the organic film layer, in addition to the electrical connection lines for connecting the transistors in the adjacent pixel unit regions passing through. The advantages lie in that: by concentratively disposing the inorganic materials having strong rigidity and poor flexibility, the non-pixel unit regions having less inorganic materials are provided, so that the flexibility of the non-pixel unit regions is far stronger than that of the pixel unit regions. Since the pixel unit regions and the non-pixel unit regions are alternately disposed, during the bending of the flexible OLED panel, the non-pixel unit regions having good flexibility are firstly bent. As such, the risk of breakage of the anodes in the pixel unit regions is reduced, and the overall flexibility of the flexible OLED panel is improved.

In an optional solution, the non-pixel unit regions have only the electrical connection lines and the organic film layer. Reducing the inorganic film layer in the non-pixel unit regions as many as possible may improve the flexibility, that is, the bending property, of the non-pixel unit regions.

In an optional solution, the electrical connection lines include scan lines arranged in rows, as well as data lines and power lines arranged in columns. In other optional solutions, the electrical connection lines may further include other control lines.

In an optional solution, the anodes are located above the transistors. The transistors include a switching transistor and a driving transistor. A whole or part of the switching transistor and/or the driving transistor fall within the orthographic projection of the anode. The overlapping area between the projections of the anode and the transistors is increased, so that the areas of the non-pixel unit regions provided may be increased, and the overall flexibility of the flexible OLED panel is improved.

In an optional solution, the anode has an inorganic support layer on its lower surface. The inorganic support layer may enhance the rigidity of the pixel unit region and reduce the flexibility thereof, thereby further increasing the contrast between the pixel unit regions and non-pixel unit regions in terms of rigidity and flexibility. As such, when the flexible OLED panel is bent, it is favorable for the non-pixel unit regions to be bent first.

In an optional solution, the pixel unit regions include a plurality of sub-pixels. The sub-pixels are arranged around a center. Each sub-pixel is corresponding to a pixel circuit and an anode. The anode is located above the transistors corresponding to the pixel circuit. The transistors include a switching transistor and a driving transistor. The anode and a drain of the driving transistor are connected via a conductive plug, and the conductive plugs connected with the anode of the sub-pixel is gathered toward a center. The gathering arrangement of the conductive plug of each pixel is also a way to enhance the rigidity of the pixel unit region and reduce the flexibility thereof.

Figure 1:
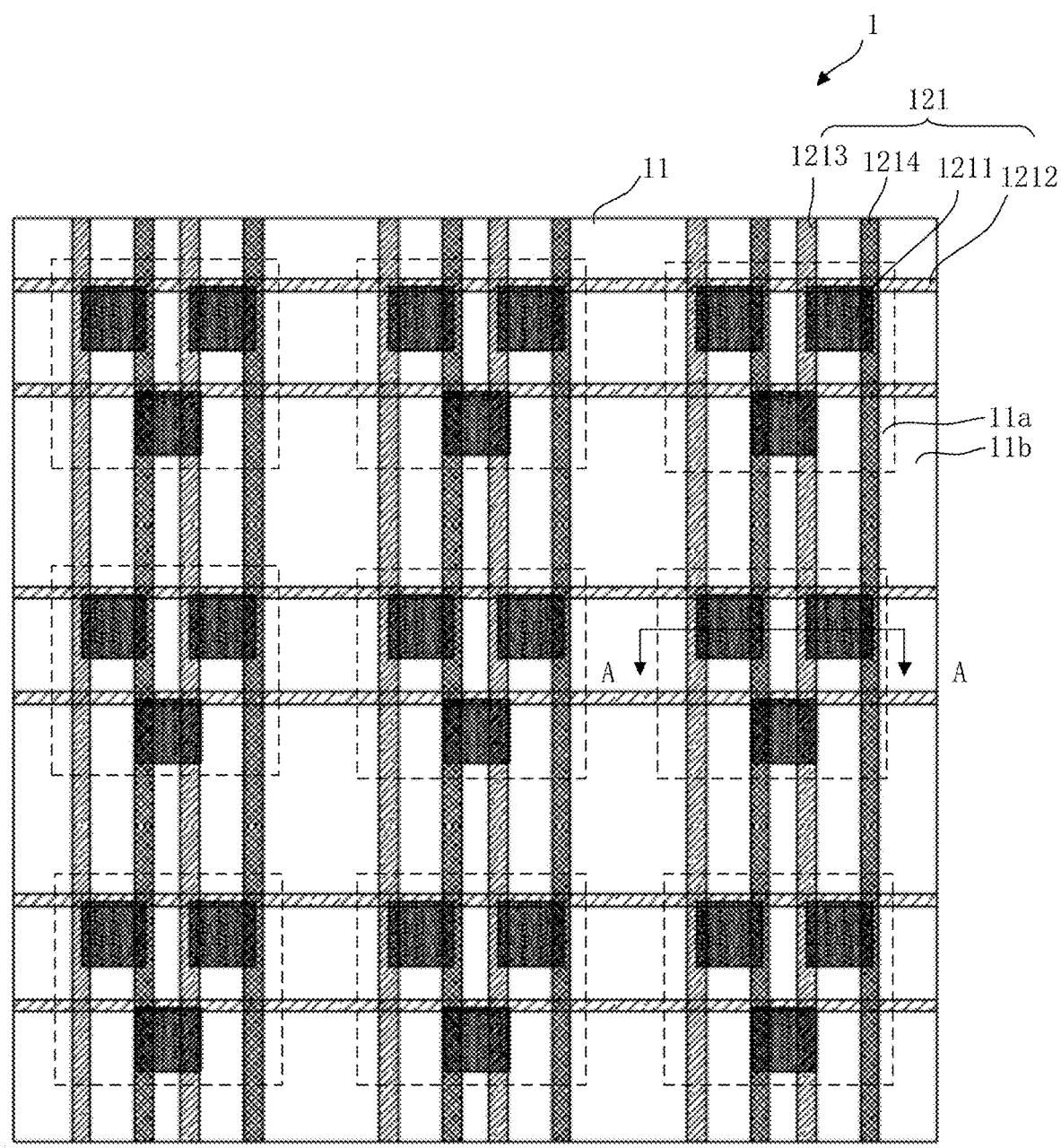
FIG. 1 is a schematic view illustrating a partial structure of a flexible OLED panel according to an embodiment of the present application.

To facilitate the understanding of the present application, all reference numerals appearing in the present application are listed below:

| | |
|---|---|
| flexible OLED panel 1, 1', 1" | solid flexible substrate 11 |
| OLED light emitting element 12 | array pixel circuit 121 |
| pixel unit region 11a | non-pixel unit region 11b |
| transistor 1211 | anode 122a |
| inorganic material layer 14 | conductive plug 15 |
| scan line 1212 | data line 1213 |
| power line 1214 | organic film layer 13 |
| inorganic support layer 16 | |

DETAILED DESCRIPTION

In order to make the above objects, features and advantages of the present application more apparent and understandable, the specific embodiments of the present application will be described in detail below with reference to the accompanying drawings.

During the bending of a flexible OLED (Organic Light-Emitting Diode) display panel, anodes are subjected to tension and pressure, which causes crack or breakage. In addition, transparent conductive oxides (such as indium tin oxides (referred briefly to as ITOs)) serving as the anodes are more brittle and less flexible than other materials in a display region, and thus cracks are easy to occur during the bending of the flexible OLED display panel. In this case, some regions of the anodes fail to receive signals from transistors (e.g., thin film transistors (referred briefly to as TFTs)) in pixel circuits, thereby causing the failure of the flexible OLED display panel.

In view of this, the present application provides a display device and a flexible OLED panel thereof to improve the bending performance, so as to solve the above-described technical problems.

Figure 2:
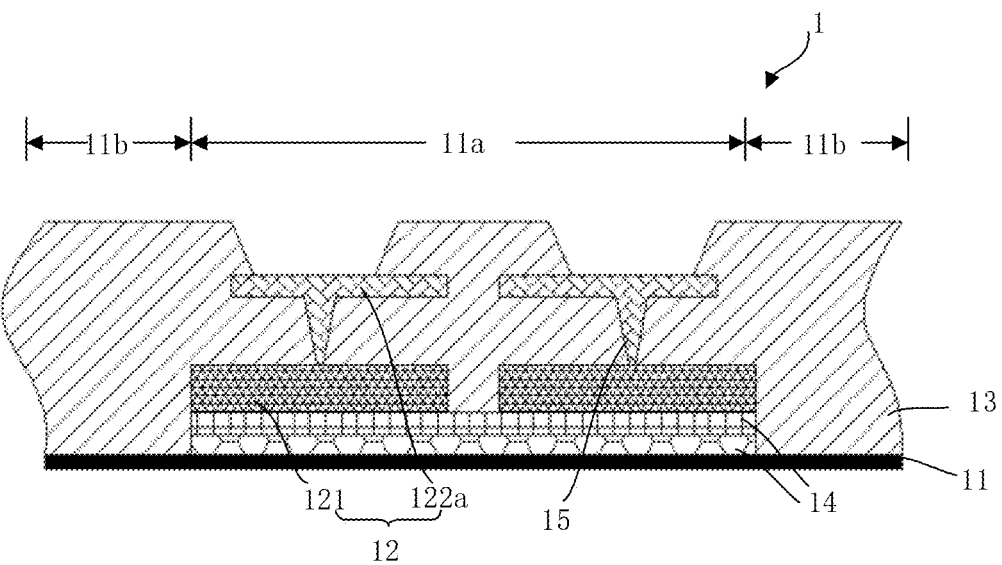
FIG. 2 is a schematic view illustrating a structure in which an anode is added to and shown in a cross-sectional structure taken along a line AA in FIG. 1.

FIG. 1 is a schematic view illustrating a partial structure of a flexible OLED panel according to an embodiment of the present application. FIG. 2 is a schematic view illustrating a structure in which an anode is added to and shown in a cross-sectional structure taken along a line AA in FIG. 1.

Referring to FIGS. 1 and 2, the flexible OLED panel 1 includes a flexible substrate 11, and OLED light emitting elements 12 on the flexible substrate 11. The OLED light emitting element 12 includes a pixel circuit 121 and a functional layer disposed above the pixel circuit 121. The pixel circuit 121 includes a plurality of transistors 1211, and the functional layer includes an anode 122a, an OLED light emitting layer (not shown), and a cathode (not shown) stacked from bottom to top. The pixel circuit 121 may be an array circuit. The flexible substrate 11 may be a solid flexible substrate.

The flexible OLED panel 1 is divided into pixel unit regions 11a and non-pixel unit regions 11b. The pixel unit regions 11a are arranged in an array. The non-pixel unit region 11b is between adjacent pixel unit regions 11a. The anode 122a and the transistors 1211 are located in the pixel unit region 11a. Electrical connection lines between the transistors 1211 in the adjacent pixel unit regions 11a pass through the non-pixel unit region 11b, and a part of the electrical connection lines located in the non-pixel unit region 11b is coated by an organic film layer 13.

The material of the solid flexible substrate 11 may be at least one of polyimide, polyethylene naphthalate, polyethylene terephthalate, polyarylate, polycarbonate, polyether sulfone or polyetherimide.

The pixel unit regions 11a may further include an inorganic material layer 14. The inorganic material layer 14 may be made from at least one of silicon nitride, silicon oxynitride, or silicon oxide, and formed into one layer, two layers, or multiple layers. When the inorganic material layer 14 is made from silicon nitride or silicon oxynitride, the inorganic material layer 14 may serve as a passivation layer configured to prevent external moisture and oxygen from diffusing upward from the solid flexible substrate 11. When the inorganic material layer 14 is made from silicon oxide, the inorganic material layer 14 may serve as an adhesive layer configured to improve the adhesion between the solid flexible substrate 11 and inorganic materials in the array pixel circuit 121 subsequently provided thereon, so as to prevent the peeling therebetween.

In FIGS. 1 and 2, the array pixel circuit 121 of the OLED light emitting element 12 may include a plurality of thin film transistors 1211, such as a switching transistor and a driving transistor, and a capacitor (not shown). A drain of the driving transistor is connected with the anode 122a in the functional layer of the OLED light emitting element via a conductive plug 15, which facilitates the injection of holes. A common electrode (not shown) located above acts as the cathode in the functional layer of the OLED light emitting element.

Referring to FIG. 1, the array pixel circuit 121 may include, in addition to the thin film transistors 1211 and the capacitor (not shown), electrical connection lines configured to connect the transistors 1211 in the adjacent pixel unit regions 11a. The electrical connection lines may include scan lines 1212 arranged in rows, as well as data lines 1213 and power lines 1214 arranged in columns. The data lines 1213 and the power lines 1214 may be located at the same layer, but the data lines 1213 and the power lines 1214 are located at a different layer from the scan lines 1212.

The working process of the array pixel circuit 121 is as follows: a gate of the switching transistor is electrically connected with the scan line 1212, a source of the switching transistor is connected to the data line 1213, and the switching transistor is turned on and supplies an electrical signal in the data line 1213 to the driving transistor when a scan signal of the scan line 1212 is valid, so that the driving transistor is turned on and a voltage signal in the power line 1214 is supplied to the anode 122a. A potential difference is formed between the anode 122a and the cathode, and holes of the anode 122a and electrons of the cathode are combined at the light emitting layer to emit light, thereby realizing a display function.

During the working process, a capacitor between a drain of the switching transistor and a source of the driving transistor may provide a stable turn-on voltage for a gate of the driving transistor.

Each pixel unit region may include a plurality of sub-pixels, such as a red sub-pixel, a green sub-pixel, and a blue sub-pixel. Each sub-pixel is corresponding to one pixel circuit.

Each pixel unit region 11a as shown in FIG. 1 includes three sub-pixels, and the three sub-pixels share the data line 1213 and the power line 1214. In other embodiments, the sub-pixels may be connected with the data line 1213 and the power line 1214 separately.

Referring to FIG. 2, in the pixel unit region 11a, a whole or part of the switching transistor and/or the driving transistor may fall within an orthographic projection of the anode 122a. In this way, the overlapping area between the projections of the anode 122a and the transistors 1211 is increased, so that the areas of the non-pixel unit regions 11b that can be provided may be increased.

In other embodiments, the transistors 1211 in the array pixel circuit 121 may include other transistors in addition to the switching transistor and the driving transistor. The electrical connection lines between the transistors 1211 in the adjacent pixel unit regions 11a may also have other control lines in addition to the scan lines 1212 arranged in rows, as well as the data lines 1213 and the power lines 1214 arranged in columns. The specific structure of the array pixel circuit 121 is not limited in the present application.

As shown in FIGS. 1 and 2, in the non-pixel unit region 11b, the remaining part may be substantially formed with the organic film layer 13, in addition to the scan lines 1212 arranged in rows, as well as the data lines 1213 and the power lines 1214 arranged in columns. The organic film layer 13 may improve the flexibility of the non-pixel unit regions 11b. The larger the proportion of the organic film layer 13 in the non-pixel unit regions 11b, the better the flexibility of the non-pixel unit regions 11b is. The material of the organic film layer 13 may be at least one of polyimide, polyethylene naphthalate, polyethylene terephthalate, polyarylate, polycarbonate, polyether sulfone or polyetherimide.

In the pixel unit region 11a, the organic film layer 13 may be provided between the anode 122a and the transistors 1211, and the conductive plug 15 is formed in the organic film layer 13.

In other embodiments, an inorganic film layer such as silicon dioxide layer may be provided between the anode 122a and the transistors 1211. In this case, the inorganic film layer is equivalent to a dielectric layer, and the conductive plug 15 is formed in the dielectric layer.

An encapsulation layer may also be provided on the OLED light emitting elements 12. The encapsulation layer may include a plurality of layers in Thin Film Encapsulation (referred briefly to as TFE). The plurality of layers may be of a three-layer structure composed of silicon nitride layer, an organic layer, and silicon nitride layer for example, and may also be a laminate layer combined by organic material layers and inorganic material layers. The present application is not limited thereto.

In the flexible OLED panel 1, by dividing the flexible OLED panel 1 into the pixel unit regions 11a and the non-pixel unit regions 11b, the anodes 122a having strong rigidity and poor flexibility and the transistors 1211 including a plurality of inorganic material layers in the array pixel circuits 121 are concentratively disposed in the pixel unit regions 11a, and the non-pixel unit regions 11b are substantially the organic film layer 13, in addition to the electrical connection lines for connecting the transistors 1211 in the adjacent pixel unit regions 11a passing through. Rigidity and flexibility represent the ability of materials to resist elastic deformation under an external force.

The above-described solution has the advantage that the non-pixel unit regions 11b with less inorganic material layers are provided by concentratively disposing the inorganic material layers having strong rigidity and poor flexibility, so that the flexibility of the non-pixel unit regions 11b is far stronger than that of the pixel unit regions 11a. Since the pixel unit regions 11a and the non-pixel unit regions 11b are alternately disposed, during the bending of the flexible OLED panel 1, the non-pixel unit regions 11b having good flexibility are firstly bent. As such, the risk of breakage of the anodes 122a in the pixel unit regions 11a is reduced, and the overall flexibility of the flexible OLED panel 1 is improved.

In addition to being used as a display element, the flexible OLED panel 1 may also be used as a touch panel by disposing a touch layer on the encapsulation layer. The flexible OLED panel 1 as a semi-finished product may even be integrated and assembled with other components to form a display device such as a mobile phone, a tablet computer (PAD), and a vehicle-mounted display screen. The pixel unit regions 11a and non-pixel unit regions 11b having large differences in terms of rigidity and flexibility may also buffer the stressing force applied to the solid flexible substrate 11 during the touch.

Figure 3:
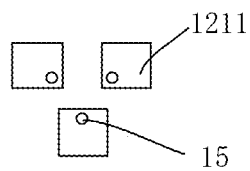
FIG. 3 is a schematic view illustrating a structure of a pixel unit region of a flexible OLED panel according to another embodiment of the present application.
Figure 4:
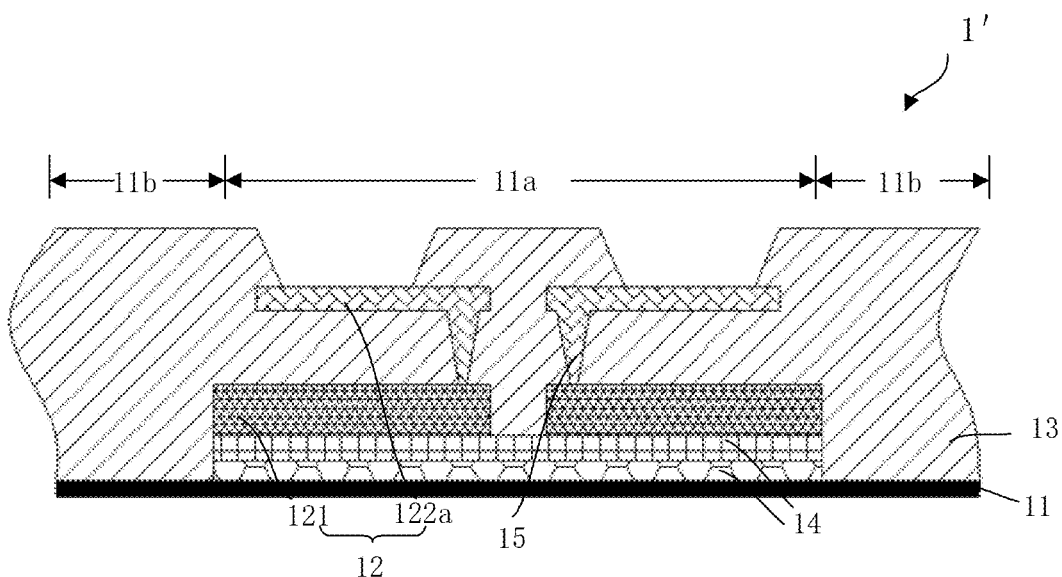
FIG. 4 is a schematic view illustrating a structure in which an anode is added to and shown in a cross-sectional structure of FIG. 3.

FIG. 3 is a schematic view illustrating a structure of a pixel unit region of a flexible OLED panel according to another embodiment of the present application. FIG. 4 is a schematic view illustrating a structure in which an anode is added to and shown in a cross-sectional structure in FIG. 3. Referring to FIGS. 1 to 4, a flexible OLED panel 1' in this embodiment has substantially the same structure as the flexible OLED panel 1 in FIG. 1, and their difference lies only in that: in each pixel unit region 11a of the flexible OLED panel 1', each sub-pixel is corresponding to one pixel circuit 121 and one anode 122a. The anode 122a is located above a plurality of transistors 1211 of a corresponding pixel circuit 121. The plurality of transistors 1211 include a switching transistor and a driving transistor. The conductive plugs 15 connected with the anode 122a of each sub-pixel are gathered toward a center surrounded by sub-pixels.

For example, referring to FIG. 1, there are three sub-pixels such as the red sub-pixel, the green sub-pixel, and the blue sub-pixel in one pixel unit region 11a. The three sub-pixels are arranged into a triangular shape, and the conductive plugs 15 are gathered toward a center of the triangular shape.

The gathering arrangement of the conductive plugs 15 of each sub-pixel may further enhance the rigidity of the pixel unit region 11a and reduce the flexibility thereof, thereby increasing the contrast between the pixel unit regions 11a and non-pixel unit regions 11b in terms of rigidity and flexibility. As such, when the flexible OLED panel 1' is bent, the non-pixel unit regions 11b tend to be bent first.

Figure 5:
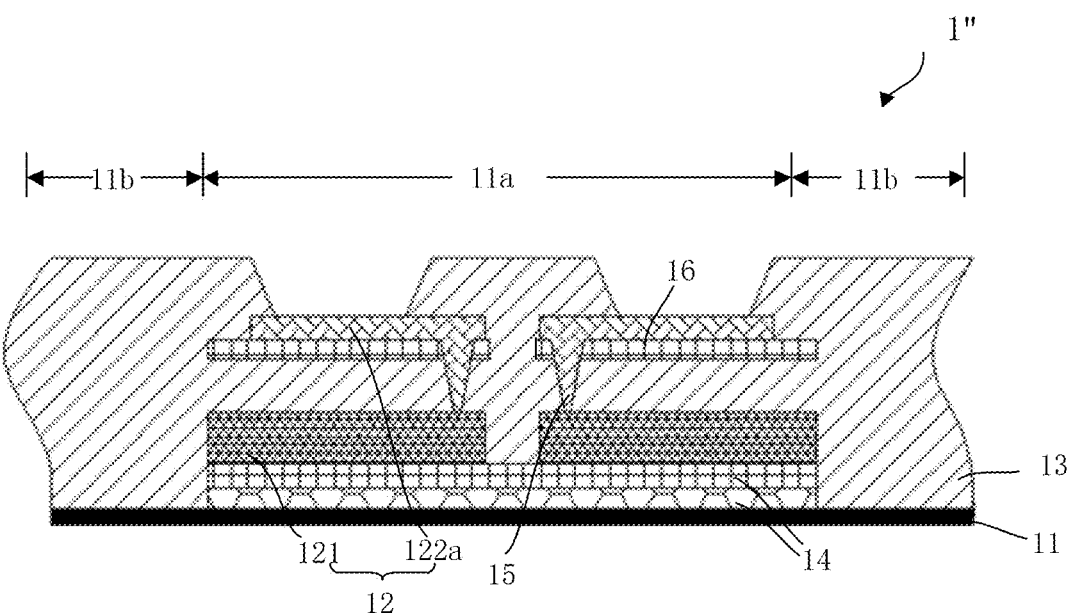
FIG. 5 is a schematic view illustrating a cross-sectional structure of a flexible OLED panel according to still another embodiment of the present application.

FIG. 5 is a schematic view illustrating a cross-sectional structure of a flexible OLED panel according to still another embodiment of the present application. Referring to FIG. 5, the flexible OLED panel 1" in this embodiment has substantially the same structure as the flexible OLED panel 1' in FIG. 4, and their difference lies only in that: in the flexible OLED panel 1", an inorganic support layer 16 is provided on a lower surface of the anode 122a. As shown in FIG. 5, since there is a spacing distance between anodes 122, the inorganic support layers 16 corresponding to anodes 122 are of a fragmented type.

The material of the inorganic support layer 16 may be at least one of silicon dioxide, silicon nitride, or silicon oxynitride, and these materials may enhance the rigidity of pixel unit regions 11a and reduce the flexibility thereof.

Figure 6:
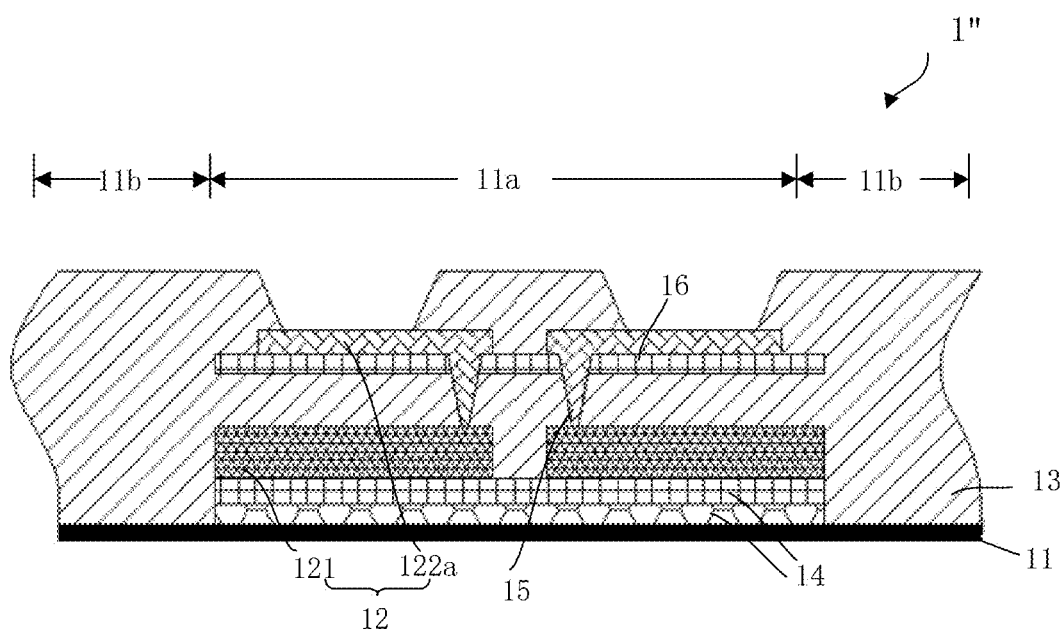
FIG. 6 is a schematic view illustrating a cross-sectional structure of a flexible OLED panel according to yet another embodiment of the present application.

FIG. 6 is a schematic view illustrating a cross-sectional structure of a flexible OLED panel according to still another embodiment of the present application. Referring to FIG. 6, inorganic support layers 16 on lower surfaces of anodes 122a each corresponding to respective sub-pixels may be connected integrally, so as to improve the support performance on one hand and simplify the process steps of manufacturing the inorganic support layers 16 on the other hand.

Although the present application is disclosed above, the present application is not limited thereto. Any changes and modifications may be made by those skilled in the art without departing from the spirit and scope of the application, and the protection scope of the present application shall be defined by the content of the claims.

The invention claimed is:

1. A flexible OLED panel, comprising:
a flexible substrate; and
a plurality of OLED light emitting elements positioned on the flexible substrate, the plurality of OLED light emitting elements comprising a plurality of pixel circuits and a plurality of functional layers disposed above the plurality of pixel circuits, the plurality of functional layers comprising a plurality of anodes,
wherein the flexible OLED panel further comprises a plurality of pixel unit regions and a plurality of non-pixel unit regions, the plurality of pixel unit regions are arranged in an array, each of the plurality of non-pixel unit regions is disposed between adjacent ones of the plurality of pixel unit regions,
at least one of the plurality of anodes and corresponding ones of a plurality of transistors in the plurality of pixel circuits are located in one of the plurality of pixel unit regions, and
respective transistors in the adjacent ones of the plurality of pixel unit regions are connected via a plurality of electrical connection lines, so that the plurality of electrical connection lines pass through at least one of the plurality of non-pixel unit regions, wherein
a portion of the plurality of electrical connection lines that is in the at least one of the plurality of non-pixel unit regions is coated by an organic film layer,
wherein each of the pixel unit regions is surrounded by corresponding non-pixel unit regions, each of the pixel unit regions comprises a plurality of sub-pixels, the plurality of sub-pixels in the pixel unit region are arranged around a center, a distance between two adjacent sub-pixels respectively located in two adjacent pixel unit regions is larger than a distance between two adjacent sub-pixels in one pixel unit region,
each of the plurality of sub-pixels is corresponding to one of the plurality of pixel circuits and one of the plurality of anodes,
the anode is located above ones of the plurality of transistors which are in the corresponding one of pixel circuits,
the plurality of transistors comprise a switching transistor and a driving transistor,
each of the pixel unit regions comprises a plurality of conductive plugs,
the one of the plurality of anodes and a drain of the driving transistor are connected via corresponding one of the plurality of conductive plugs, and the plurality of conductive plugs in one pixel unit region are gathered toward the center.

2. The flexible OLED panel according to claim 1, wherein each of the plurality of non-pixel unit regions comprises a portion of the plurality of electrical connection lines which is coated by the organic film layer, and the organic film layer.

3. The flexible OLED panel according to claim 1, wherein the plurality of electrical connection lines comprise a plurality of scan lines arranged in rows, as well as data lines and power lines arranged in columns.

4. The flexible OLED panel according to claim 1, wherein the plurality of anodes are located above the plurality of transistors, the plurality of transistors comprise the switching transistor and the driving transistor, and at least one of the switching transistors and the driving transistors entirely falls within an orthographic projection of a corresponding one of the plurality of anodes.

5. The flexible OLED panel according to claim 1, wherein the plurality of anodes are located above the plurality of transistors, the plurality of transistors comprise the switching transistor and the driving transistor, and at least one of the switching transistors and the driving transistors partially falls within an orthographic projection of a corresponding one of the plurality of anodes.

6. The flexible OLED panel according to claim 1, wherein an inorganic support layer is provided on a lower surface of at least one of the plurality of anodes.

7. The flexible OLED panel according to claim 1, wherein each of the plurality of pixel unit regions comprises the plurality of sub-pixels, each of the plurality of sub-pixels is corresponding to one of the plurality of anodes, a plurality of inorganic support layers formed at lower surfaces of the plurality of anodes are connected into a whole.

8. The flexible OLED panel according to claim 1, wherein the plurality of sub-pixels comprise a red sub-pixel, a green sub-pixel, and a blue sub-pixel, the red sub-pixel, the green sub-pixel and the blue sub-pixel are arranged into a triangular shape, and the plurality of conductive plugs corresponding to the red sub-pixel, the green sub-pixel and the blue sub-pixel are gathered toward a center of the triangular shape.

9. The flexible OLED panel according to claim 1, wherein a film layer is disposed between the one of the plurality of anodes and the corresponding ones of the plurality of transistors, and the plurality of conductive plugs are formed in the film layer.

10. The flexible OLED panel according to claim 9, wherein the film layer is at least one of an organic film layer or an inorganic film layer.

11. The flexible OLED panel according to claim 8, wherein a film layer is disposed between the one of the plurality of anodes and the corresponding ones of the plurality of transistors, and the plurality of conductive plugs are formed in the film layer.

12. The flexible OLED panel according to claim 11, wherein the film layer is at least one of an organic film layer or an inorganic film layer.

13. The flexible OLED panel according to claim 6, wherein a material of the inorganic support layer comprises at least one of silicon dioxide, silicon nitride, or silicon oxynitride.

14. The flexible OLED panel according to claim 1, wherein the plurality of pixel unit regions comprise inorganic material layers, each of the inorganic material layers comprises at least one of a silicon nitride layer, a silicon oxynitride layer, or a silicon oxide layer, and each of the inorganic material layers is formed into at least one layer.

15. The flexible OLED panel according to claim 1, wherein a gathering arrangement of the conductive plugs in each pixel unit region enhances a rigidity of the pixel unit regions, such that, when the flexible OLED panel is bent, the non-pixel unit regions are bent first.

16. A display device, comprising a flexible OLED panel, the flexible OLED panel comprising:
a flexible substrate; and
a plurality of OLED light emitting elements positioned on the flexible substrate, the plurality of OLED light emitting elements comprising a plurality of pixel circuits and a plurality of functional layers disposed above the plurality of pixel circuits, the plurality of functional layers comprising a plurality of anodes,
wherein the flexible OLED panel further comprises a plurality of pixel unit regions and a plurality of non-pixel unit regions, the plurality of pixel unit regions are arranged in an array, each of the plurality of non-pixel unit regions is disposed between adjacent ones of the plurality of pixel unit regions,
at least one of the plurality of anodes and corresponding ones of a plurality of transistors in the plurality of pixel circuits are located in one of the plurality of pixel unit regions, and respective transistors in the adjacent ones of the plurality of pixel unit regions are connected via a plurality of electrical connection lines, so that the plurality of electrical connection lines pass through at least one of the plurality of non-pixel unit regions, wherein a portion of the plurality of electrical connection lines that is in the at least one of the plurality of non-pixel unit regions is coated by an organic film layer,
wherein each of the pixel unit regions is surrounded by corresponding non-pixel unit regions, each of the pixel unit regions comprises a plurality of sub-pixels, the plurality of sub-pixels in the pixel unit region are arranged around a center, a distance between two adjacent sub-pixels respectively located in two adjacent pixel unit regions is larger than a distance between two adjacent sub-pixels in one pixel unit region,
each of the plurality of sub-pixels is corresponding to one of the plurality of pixel circuits and one of the plurality of anodes,
the anode is located above ones of the plurality of transistors which are in the corresponding one of pixel circuits,
the plurality of transistors comprise a switching transistor and a driving transistor,
each of the pixel unit regions comprises a plurality of conductive plugs,
the one of the plurality of anodes and a drain of the driving transistor are connected via corresponding one of the plurality of conductive plugs, and the plurality of conductive plugs in one pixel unit region are gathered toward the center.

17. The display device according to claim 16, wherein each of the plurality of non-pixel unit regions comprises a portion of the plurality of electrical connection lines which is coated by the organic film layer, and the organic film layer.

18. The display device according to claim 16, wherein the plurality of electrical connection lines comprise a plurality of scan lines arranged in rows, as well as data lines and power lines arranged in columns.

19. The display device according to claim 16, wherein the plurality of anodes are located above the plurality of transistors, the plurality of transistors comprise the switching transistor and the driving transistor, and at least one of the switching transistors and the driving transistors at least partially falls within an orthographic projection of a corresponding one of the plurality of anodes.

20. The display device according to claim 16, wherein an inorganic support layer is provided on a lower surface of at least one of the plurality of anodes.

\* \* \* \* \*